United States Patent
Graf

(10) Patent No.: US 8,126,225 B2
(45) Date of Patent: Feb. 28, 2012

(54) METHOD FOR GENERATING 2D RECONSTRUCTION IMAGES IN THE SCOPE OF IMAGE POSTPROCESSING FROM A 3D IMAGE DATA SET OF A STUDY OBJECT RECORDED PARTICULARLY BY MEANS OF A MAGNETIC RESONANCE DEVICE

(75) Inventor: Gudrun Graf, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1254 days.

(21) Appl. No.: 11/522,335

(22) Filed: Sep. 18, 2006

(65) Prior Publication Data

US 2007/0066884 A1    Mar. 22, 2007

(30) Foreign Application Priority Data

Sep. 19, 2005   (DE) .................. 10 2005 044 652

(51) Int. Cl.
*G06K 9/00* (2006.01)
(52) U.S. Cl. ........ 382/128; 382/131; 382/276; 382/285; 382/293; 382/294; 378/4
(58) Field of Classification Search .................. 324/100, 324/309, 307; 382/128, 131, 132, 285; 345/419, 345/619
See application file for complete search history.

(56) References Cited

U.S. PATENT DOCUMENTS

| | | | |
|---|---|---|---|
| 5,222,499 A * | 6/1993 | Allen et al. ................. | 600/426 |
| 5,719,498 A * | 2/1998 | Hausmann ................... | 324/309 |
| 6,266,453 B1 | 6/2001 | Hibbard | |
| 6,484,048 B1 * | 11/2002 | Hoshino et al. ............ | 600/410 |
| 6,529,762 B1 | 3/2003 | Ladebeck | |
| 2001/0036303 A1 * | 11/2001 | Maurincomme et al. ..... | 382/132 |
| 2003/0144589 A1 | 7/2003 | Roell | |
| 2004/0204644 A1 | 10/2004 | Tsougarakis et al. | |
| 2005/0038336 A1 | 2/2005 | Nimsky | |
| 2005/0047544 A1 * | 3/2005 | Fu et al. ..................... | 378/63 |
| 2005/0088177 A1 | 4/2005 | Anders | |
| 2005/0143641 A1 | 6/2005 | Tashiro | |
| 2005/0203381 A1 | 9/2005 | Harder | |

OTHER PUBLICATIONS

Estares et al. "Robust Multiresolution Alignment of MRI Brain Volumes",2000, Magnetic Resonance in Medicine 43:705-715.*
Van den Eisen et al. "Automatic Registration of CT and MR Brain Images of Using Correlation of Geometrical Features", Dec. 1996, IEEE Transactions on Medical Imaging, vol. 15, No. 6.*
German Office Action dated Aug. 30, 2006.
Lothar Baetz et al., "Imaging Systems for Medical Diagnostics", edited by Arnulf Oppelt.
"Syngo Operator Manual", pp. J.4-5-J.4-6.

* cited by examiner

*Primary Examiner* — Sath V Perungavoor
*Assistant Examiner* — Jason Heidemann
(74) *Attorney, Agent, or Firm* — Harness, Dickey & Pierce, P.L.C.

(57) ABSTRACT

A method is disclosed for generating 2D reconstruction images in the scope of image post-processing from a 3D image data set of a study object recorded particularly by use of a magnetic resonance device. In the method, the position of the 2D reconstruction layers in which the 2D reconstruction images lie is defined with the aid of layer position information which defines the position of individual 2D recording layers in which 2D layer images are recorded after recording the 3D image data set of the study object, or have already been recorded, and which is optionally stored in an operating mode for automatic layer position adaptation, or with the aid of layer position information defining 2D reconstruction layers which is stored in an operating mode for automatic layer position adaptation.

9 Claims, 2 Drawing Sheets

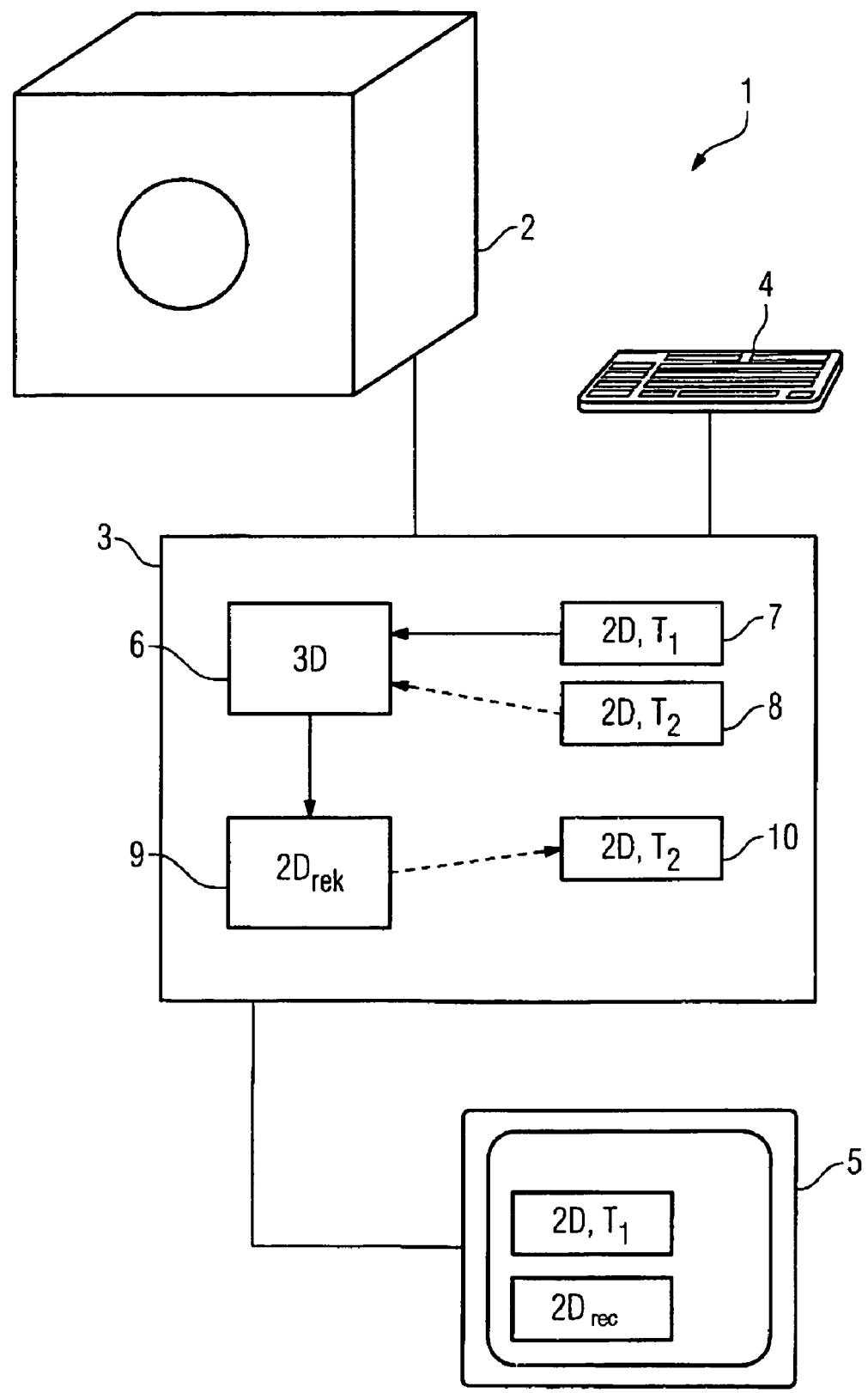

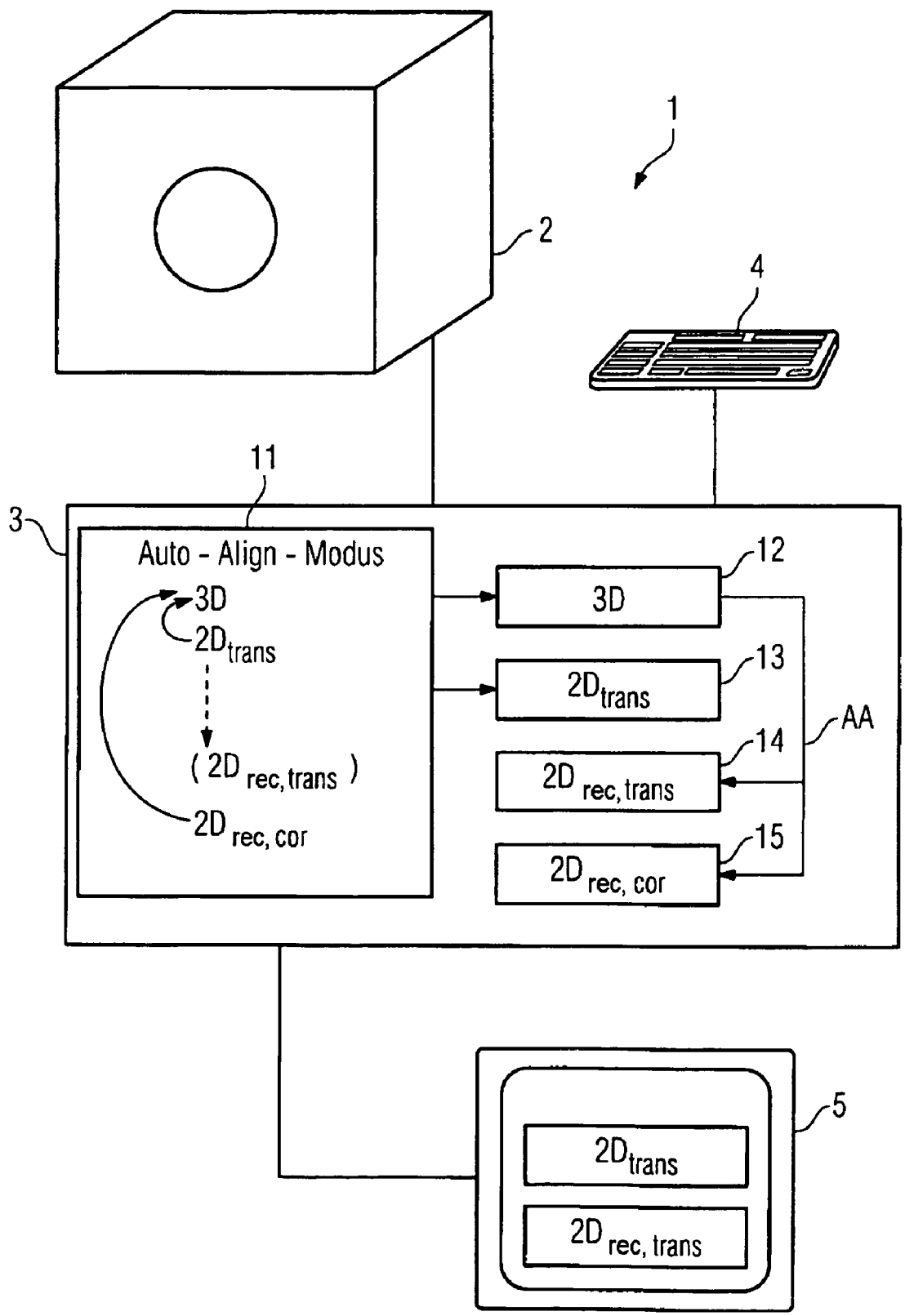

METHOD FOR GENERATING 2D RECONSTRUCTION IMAGES IN THE SCOPE OF IMAGE POSTPROCESSING FROM A 3D IMAGE DATA SET OF A STUDY OBJECT RECORDED PARTICULARLY BY MEANS OF A MAGNETIC RESONANCE DEVICE

PRIORITY STATEMENT

The present application hereby claims priority under 35 U.S.C. §119 on German patent application number DE 10 2005 044 652.3 filed Sep. 19, 2005, the entire contents of which is hereby incorporated herein by reference.

FIELD

The invention generally relates to a method for generating 2D reconstruction images in the scope of image post-processing from a 3D image data set of a study object recorded, particularly via a magnetic resonance device.

BACKGROUND

A 3D image data set of a study object, for example the head, is often recorded for example via a magnetic resonance device by recording a plurality of localizer images defined in their position. The study object is thus available as a complete data set in a first recording mode, in which the localizer images are conventionally recorded. Further image recordings of the study region are often subsequently recorded in various recording modes as 2D images, the different recording modes respectively defining different weightings in respect of the image recording. Examples which may be mentioned for such different recording modes are $T_1$ measurements and $T_2$ measurements, which relate to different nuclear relaxation times.

In the scope of these measurements a predetermined number of individual 2D layer images of the study volume are recorded, for example 19 individual layer images for head recordings, which are defined via corresponding measurement information in their precise position in the coordinate system of the image recording unit.

Besides the 2D layer images which have been recorded for example in the $T_1$ and $T_2$ modes and are consequently weighted correspondingly in their image information, it is now also often desired to be able to evaluate corresponding layer images which have been recorded in another recording mode, for example the one in which the 3D image data set was recorded. For a meaningful comparison, it is necessary in such a case for the 2D reconstruction images reconstructable from the 3D image data set to be reconstructed in the same layer position as that in which the 2D layer images were recorded in the scope of the $T_1$ and/or $T_2$ measurement.

To this end, it is necessary for the operating person to manually position or angulate the desire 2D reconstruction planes for the image post-processing, i.e. the definition of the 2D reconstruction planes must be manually defined, which is laborious and often takes place relatively inaccurately since the orientation and positioning of the layers to be reconstructed is visually controlled by the user. It is also generally difficult to define the position of the reconstruction images in such a way that the anatomical structures which the doctor wishes to see are actually shown by the 2D reconstruction images in the image post-processing, since the position of the study object in the magnetic resonance apparatus is not always known or the same with respect to the coordinate system of the apparatus.

SUMMARY

A method is provided, in at least one embodiment, which permits simplified and improved 2D reconstruction image compilation from a 3D image data set in the scope of image post-processing.

In a method, of at least one embodiment of the invention, the position of the 2D reconstruction layers in which the 2D reconstruction images lie should be defined with the aid of layer position information which defines the position of individual 2D recording layers in which 2D layer images are recorded after recording the 3D image data set of the study object, or have already been recorded, and which is optionally stored in an operating mode for automatic layer position adaptation, or with the aid of layer position information defining 2D reconstruction layers which is stored in an operating mode for automatic layer position adaptation.

In the method according to at least one embodiment of the invention, according to a first configuration the measurement or layer position information which define the position of individual layers in which 2D layer images of the study object are intended to be recorded at a time after the recording of the 3D image data set, or have already been recorded, is used as reconstruction parameters. That is, this information specifically defines the position of the layers in which the 2D reconstruction images to be reconstructed should lie in the 3D image data set. The information defining the layer position of a consecutive study to be carried out or already carried out is thus in effect "copied" and used as defining the layer positions in the scope of the post-processing of the 3D image data set.

For the observer, this provides the opportunity to obtain 2D reconstruction images from the 3D image data set, which show the study object in precisely the same layers as those in which the study object is represented in the individual 2D layer images of the consecutive study. Comparability of the 2D layer images actually recorded and of the 2D reconstruction images is therefore possible, because they are identical in position.

A compilation of 2D reconstruction images, which is positionally accurate in particular from an anatomical viewpoint, can moreover be achieved in that the 2D reconstruction takes place with the aid of position information which defines 2D layers in an operating mode for automatic layer position adaptation. Such an operating mode for automatic layer position adaptation, often also referred to as an auto-align mode, uses recognition software which automatically recognizes correspondingly desired layer positions in a 3D image data set with the aid of anatomical structures or the like, generally by using an image atlas. If either 2D images subsequently to be recorded or merely 2D reconstruction layers are now defined in such an operating mode, then there will likewise be a high positional accuracy of the reconstruction images obtained, either in relation to subsequently recorded 2D layer images which are defined in the auto-align mode with a different weighting, for example $T_1$ or $T_2$ images, or in relation to the reconstruction planes defined there but determined exactly in their anatomical position via the recognition software. This configuration thus also uses the operating mode for automatic layout position adaptation or auto-align mode, which is conventionally used exclusively for carrying out measurements, in the scope of the image post-processing by using layer position information defined in it—whether that in which 2D layer recordings actually take place or else that which merely defines 2D reconstruction planes—for the reconstruction image compilation in the scope of the image post-processing.

In any event, irrespective of how the 2D reconstruction image compilation now takes place, this obviates the manual orientation and positioning of the layers to be reconstructed as has previously been customary.

For the user, before recording the 2D layer images it is possible on the user side to determine the use of the layer position information defining the 2D recording layers for the 2D reconstruction image compilation. Before the actual consecutive measurement, in the scope of which for example $T_1$ or $T_2$ measurements are carried out, the user can thus already determine that the layer position information used in this case should be the basis for the subsequent 2D reconstruction image compilation from the 3D image data set. This has the advantage that the 2D reconstruction images can be reconstructed and output immediately after the end of the 2D layer image recording, or, since the layer position information is already known, the 2D reconstruction images can already be reconstructed beforehand so that they are output together with the 2D layer images immediately at the end of the 2D layer image recording.

The operator naturally also has the possibility of first carrying out a 2D layer image recording such as the aforementioned $T_1$ or $T_2$ measurements, and only then defining that the 2D recording layers used for this should also be the layers in which the 2D reconstruction image compilation takes place. Immediately after this selection, the 2D reconstruction image compilation and its output then take place.

Further possibilities for determining the reconstruction planes are obtained when the operating mode for automatic layer position adaptation is used in the scope of the image post-processing. In this case, the recording of the 3D image data set and the recording of 2D layer images in one or more recording modes can be defined in this operating mode (auto-align mode), and the layer position information defining the 2D recording layers of one or more of the recording modes may be defined for use in the 2D reconstruction image compilation. Thus, the entire subsequent image recording process is defined in this operating mode, comprising both the recording of the 3D image data set and the recording for example of $T_1$ and/or $T_2$ measurements. The operator can now define that one or more of the 2D measurements should be the basis for the subsequent reconstruction of the 2D reconstruction images from the 3D image data set, this taking place in the auto-align operating mode or by using the recognition software for layer blocks which are thus also used for the layer reconstruction.

As an alternative or in addition, it is also possible to define 2D reconstruction layers directly in this operating mode, the 2D reconstruction taking place on the basis of the layer position adaptation function. In this case no genuine measurement thus takes place in the 2D reconstruction layers, rather the layer position information specifies merely the position of the reconstruction layers in which the image reconstruction should subsequently take place in the auto-align mode. It is of course possible in the auto-align mode to define both the layer position information for subsequent image recordings, i.e. for example a 3D image data set and one or more 2D image data sets in various layers, and also a layer position information set which exclusively contains 2D reconstruction layers. These 2D reconstruction images reconstructed in this are then obtained in addition to the actually measured 2D images and the 2D reconstruction images optionally reconstructed on the basis of the actual measurement layers.

Overall, the method according to at least one embodiment of the invention offers a simple opportunity to compile positionally exact reconstruction images from a 3D image data set, in particular for direct comparability with a measured 2D series. A superposition of 2D layer images with 2D reconstruction images is also possible. Since 2D reconstruction images in selected layers can be compiled in particular comparably with parallel measured 2D images, there is furthermore the possibility that only these 2D reconstruction images reconstructed identically in layer position may be used for the findings and, for example, sent or archived for documentation purposes.

BRIEF DESCRIPTION OF THE DRAWINGS

Other advantages, features and details of the invention will be found in the example embodiments described below and with reference to the drawings, in which:

FIG. 1 shows an outline sketch of a magnetic resonance device according to an embodiment of the invention to represent the method according to an embodiment of the invention in a first variant, and FIG. 2 shows an outline sketch of a magnetic resonance device according to an embodiment of the invention to represent the method according to an embodiment of the invention in a second variant.

DETAILED DESCRIPTION OF THE EXAMPLE EMBODIMENTS

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described.

FIG. 1 shows a magnetic resonance device 1 according to an embodiment of the invention including the tomograph 2 per se as well as an associated control and image processing device 3 with an associated input device 4, here in the form of a keyboard, and an associated output monitor 5. The structure of such a magnetic resonance device is well known and does not need any further explanation.

In order to study a study object (not shown in detail), a 3D image data set 6 is firstly recorded, for example by a sequence of individual localizer layer images, via which the study volume e.g. the head is three-dimensionally imaged as a whole.

Further measurements are thereupon to be carried out for recording 2D layer images, which are respectively weighted differently. Examples indicated here are the recording of a 2D image data set in the scope of a $T_1$ measurement, denoted by the reference numeral 7, and the recording of a 2D image data set in the scope of a $T_2$ measurement, denoted by the reference numeral 8. For these 2D recordings, the individual recording layers are defined in that position.

The operator now has the opportunity, for example, to select the measurement protocol for the $T_1$ measurement 7 and define it as one which is to be applied in the scope of the image post-processing of the 3D image data set 6 to compile 2D reconstruction images 9. The 2D reconstruction images are reconstructed in precisely the same layer planes as those in which the individual 2D layer images of the $T_1$ measurement lie. With the 2D $T_1$ layer images which have actually been measured, and the 2D reconstruction images of the same layer planes from the high-resolution 3D image data set, the operator consequently obtains two different image sets which respectively show the same layer position but are weighted differently in respect of the image information. This provides direct comparability of the two images.

In the scope of defining the reconstruction layer plane, the operator merely has to select the 2D layer image measurement for which they want reconstruction images. The reconstruction planes are then automatically selected identically on the part of the control and image processing device 3, and the corresponding images are reconstructed. As shown by FIG. 1, it is of course also possible to select the $T_2$ measurement 8 for a reconstruction plane reference as indicated by the broken arrow. It is naturally furthermore possible for yet other 2D layer block measurements, which may be carried out, to be selected as a corresponding reconstruction reference, in which case a plurality of measurements in which the image recording planes are different, i.e. reconstruction references, may also be selected in the scope of a study.

Besides this, it is also possible to define that, on the basis of the layer positions of the reconstructed 2D layer reconstruction images, a following 2D measurement should take place in precisely these layer planes. By way of example it is indicated here that a 2D $T_2$ measurement 10 should take place in the layer planes of the 2D reconstruction images 9. It is thus possible not only to copy the respective layer position information from an already selected measurement protocol for the reconstruction, but also to copy the corresponding layer plane information for the 2D reconstruction image data set and base a genuine consecutive measurement in precisely these layers on it.

Depending on whether the operator bases the reconstruction on the respective correlation or referencing to determine the layer position information or uses the correlation or referencing for positioning a subsequent 2D measurement from a reconstructed 2D layer block, the corresponding reconstructed 2D layer images or the corresponding referenced recorded 2D layer images are available already during the study (inline) or not until after the respective study (offline). Thus, the referencing of the layer position information according to the invention may be carried out before or during the study, or even at an arbitrary time afterwards, the latter possibility relating primarily to the compilation of the 2D reconstruction images.

As FIG. 1 furthermore shows, it is possible to output the recorded 2D images as well as the reconstructed 2D images on the monitor 5. An example represented here is to output the 2D $T_1$ layer images and the 2D reconstruction images positionally reconstructed identically in parallel on the monitor for comparison purposes.

FIG. 2 shows the magnetic resonance device 1 according to an embodiment of the invention from FIG. 1, which is essentially constructed identically i.e. includes the tomograph 2, the control and image processing device 3, the input device 4 and the monitor 5. The example embodiment described here works in an operating mode for automatic layer adaptation (auto-align mode), this mode being denoted by the reference numeral 11 as an example in FIG. 2.

In this auto-align mode, the operator can determine beforehand which recordings they wish to take. The auto-align mode then adapts the position of the layers to be recorded automatically to the genuine position of the study object. If the head is recorded, for example, then it may lie somewhat stretched over or tilted to the side so that, when the layer images are recorded in the planes defined with respect to the machine coordinate system, the regions which are of interest to the operator may sometimes not be recorded. Via the auto-align mode 11 by resorting to an anatomical atlas, the way in which the individual layers should be positioned for the layer image measurement respectively to be carried out, so that the study region of interest is actually recorded, is now automatically determined. To this end corresponding recognition software is provided which makes it possible with the aid of the recorded 3D layer image data set, by resorting to the anatomical information, to find anatomical markers from the layer atlas with the aid of which it is then possible to determine what the genuine position of the study object is. The auto-align mode is conventionally active only for carrying out the measurements, but not in the scope of the image post-processing. According to the invention, however, the auto-align mode is now also used to compile the 2D reconstruction images in the scope of the image post-processing of the 3D image data set.

In the example shown, the operator has defined in the auto-align mode that a 3D image data set is to be recorded, and that a 2D layer image data set represented by "$2D_{trans}$" should also be recorded in the transverse direction. Furthermore, as indicated by the bracketed expression ("$2D_{rec, trans}$"), they wish that the corresponding 2D reconstruction images should be compiled precisely in the layers in which the 2D transverse images have been recorded. To this end, as represented by the arrow, referencing between the 3D measurement and the "$2D_{trans}$" measurement has been carried out by the operator.

It is furthermore defined in the auto-align mode 11 that the operator desires the compilation of 2D reconstruction images in the coronal direction, as indicated by "$2D_{rec, cor}$". Here again, as represented by the arrow, referencing is selected between the 3D measurement and the layer position information which is stored for the 2D reconstruction requirement "$2D_{rec, cor}$".

In the scope of the measurement the 3D image data set 12 is now recorded first, whereupon the 2D transverse layer images 13 are recorded still in the measurement mode by applying the layer position adaptation function of the auto-align mode. Already before or in parallel with this, since the layer position information is known with respect to the 2D transverse layers to be recorded for the 2D image data set 13, the transverse 2D reconstruction images 14 are generated automatically in the auto-align mode in the scope of post-processing the 3D image data set 12. Here as well this is thus based on an actual layer image measurement, i.e. the recording of the 2D transverse image data set 13, even though the reconstruction takes place here in the auto-align mode which is now used in the scope of the image post-processing.

The compilation of the coronal 2D reconstruction image data set 15 can actually take place in parallel with this since the corresponding layer position information, which specifies the coronal layers in which the 2D reconstruction images are to be reconstructed from the 3D image data set, is known in the auto-align mode 11. This also takes place in the auto-align mode by applying the layer position adaptation function which this operating mode offers.

The corresponding recorded and reconstructed image data can here again be output on the monitor 5, as represented by way of example for the recorded transverse 2D layer images and the reconstructed transverse 2D reconstruction layer images, so that simpler comparison is possible.

At this point it should be pointed out that the operating procedure or referencing procedure described in FIG. 1 could also be performed fully in the auto-align mode, that is to say here again the anatomical layer plane adaptation function of this mode may be applied both in the scope of the measurement and in the scope of the image post-processing to reconstruct the 2D reconstruction images.

Overall, the method according to an embodiment of the invention and the magnetic resonance device according to the invention make it possible to carry out measurements and reconstructions with exactly equal layer positions. This offers direct comparability of actually measured 2D image series with reconstructed 2D image series. A superposition of genuinely recorded 2D images with reconstructed 2D images is also possible, since precisely the same layer positions have been recorded with the same thickness etc. Advantages are also obtained in the case of a study with contrast agent administration. If a 3D measurement to generate a 3D image data set is carried out before and after the contrast agent administration, then the automated reconstruction method according to the invention has the advantage that the 2D reconstruction image data can take place directly following on from the measurement in various planes, in which case the 2D reconstruction images of both image series can actually be carried out in the same plane by respectively referencing the same layer position information as a basis for the 2D reconstruction image compilation.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program and computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a computer readable media and is adapted to perform any one of the aforementioned methods when run on a computer device (a device including a processor). Thus, the storage medium or computer readable medium, is adapted to store information and is adapted to interact with a data processing facility or computer device to perform the method of any of the above mentioned embodiments.

The storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for generating 2D reconstruction images in the scope of image post-processing from a 3D image data set of a study object, the method comprising:

defining a position of 2D reconstruction layers in which the 2D reconstruction images lie;

acquiring layer position information for 2D recording layers associated with the defined position, the layer position information defining at least one of, a position of individual 2D recording layers in which 2D layer images at least one of are recorded after recording the 3D image data set of the study object, and have already been recorded, and 2D reconstruction layers, stored in an operating mode for automatic layer position adaptation, the operating mode for automatic layer position adaptation detects the desired layer position in the 3D image data set based on anatomic structures; and using the acquired layer position information to generate the 2D reconstruction images from the 3D image data set.

2. The method as claimed in claim 1, wherein the use of the layer position information defining the 2D recording layers for a 2D reconstruction image compilation is determined by a user before recording the 2D layer images, and at least one of the 2D reconstruction images are reconstructed and output after the end of the 2D layer image recording, and the 2D reconstruction images already reconstructed at this time are output.

3. The method as claimed in claim 1, wherein the use of the layer position information defining the 2D recording layers for a 2D reconstruction image compilation is determined by a user after recording the 2D layer images, and the 2D reconstruction images are compiled and output thereafter.

4. The method as claimed in claim 1, wherein at least one of the recording of the 3D image data set and the recording of 2D layer images in at least one recording mode are defined in an operating mode for automatic layer position adaptation, and the layer position information defining the 2D recording layers of at least one recording mode is defined for use in a 2D reconstruction image compilation, and 2D reconstruction layers are defined and the 2D reconstruction takes place on the basis of a layer position adaptation function.

5. The method as claimed in claim 1, wherein the layer position information, defining a position of individual 2D recording layers in which 2D layer images have already been recorded, is stored in an operating mode for automatic layer position adaptation.

6. The method as claimed in claim 1, wherein the method is for generating 2D reconstruction images in the scope of image post-processing from a 3D image data set of a study object recorded via a magnetic resonance device.

7. A non-transitory computer readable medium including program segments for, when executed on a computer device, causing the computer device to implement the method of claim 1.

8. A non-transitory computer readable medium including program segments for, when executed on a magnetic resonance device, causing the magnetic resonance device to implement the method of claim 1.

9. A magnetic resonance device comprising a control and image processing device, the control and image processing device including a processor and a non-transitory memory device including a data structure including program segments for, when executed on the processor, causing the magnetic resonance device to implement the method of claim 1.

* * * * *